United States Patent
Herrmann et al.

(10) Patent No.: US 9,041,431 B1
(45) Date of Patent: *May 26, 2015

(54) PARTIAL RECONFIGURATION AND IN-SYSTEM DEBUGGING

(71) Applicant: Altera Corporation, San Jose, CA (US)

(72) Inventors: Alan Louis Herrmann, Sunnyvale, CA (US); David W. Mendel, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/161,460

(22) Filed: Jan. 22, 2014

Related U.S. Application Data

(63) Continuation of application No. 13/441,566, filed on Apr. 6, 2012, now Pat. No. 8,686,753.

(60) Provisional application No. 61/473,697, filed on Apr. 8, 2011.

(51) Int. Cl.
*H03K 19/177* (2006.01)
*G01R 31/28* (2006.01)
*H03K 19/0175* (2006.01)
*G01R 31/317* (2006.01)
*G01R 31/3185* (2006.01)

(52) U.S. Cl.
CPC .. *H03K 19/017581* (2013.01); *H03K 19/17756* (2013.01); *G01R 31/31705* (2013.01); *G01R 31/318519* (2013.01)

(58) Field of Classification Search
CPC ............ G06F 17/5068; G06F 17/5072; G06F 17/5081; G06F 21/76; H03K 19/17736; H03K 19/17756; H03K 19/17748; H03K 19/17776; H03K 19/17732; H03K 19/17744; G01R 31/31705; G01R 31/3177; G01R 31/318519
USPC ........... 326/38–41, 16; 716/106, 117; 714/25, 714/39, 733, 734
See application file for complete search history.

(56) References Cited

U.S. PATENT DOCUMENTS 5,870,410 A * 2/1999 Norman et al. ................ 714/725
6,150,837 A * 11/2000 Beal et al. ........................ 326/39

(Continued)

OTHER PUBLICATIONS

Notice of Allowance for U.S. Appl. No. 13/441,566 mailed Nov. 26, 2013.

*Primary Examiner* — Vibol Tan
(74) *Attorney, Agent, or Firm* — Weaver Austin Villeneuve & Sampson LLP

(57) ABSTRACT

Embedded logic is implemented in a partially reconfigurable programmable logic device (PLD), thus allowing debugging of implemented instantiations of logic after partial reconfiguration. Several instantiations of logic are received at the PLD. One instantiation of logic is implemented in a reconfigurable region of logic within the PLD. The instantiation of logic includes a port that provides a constant interface between the reconfigurable region of logic and a fixed region of logic within the PLD. The port may receive signals from probe points implemented within the reconfigurable region of logic. The port may provide the signals to a signal interface implemented within a fixed region of logic. Furthermore, an embedded logic analyzer may be implemented in either the reconfigurable region of logic or the fixed region of logic. The embedded logic analyzer receives signals from the probe points and provides signal visibility to an external computing system.

17 Claims, 8 Drawing Sheets

(56) References Cited

U.S. PATENT DOCUMENTS

| | | |
|---|---|---|
| 6,247,147 B1 | 6/2001 | Beenstra et al. |
| 6,286,114 B1 * | 9/2001 | Veenstra et al. ............... 714/39 |
| 6,389,558 B1 | 5/2002 | Herrmann et al. |
| 6,460,148 B2 | 10/2002 | Veenstra et al. |
| 6,886,092 B1 | 4/2005 | Douglass et al. |
| 6,957,283 B2 | 10/2005 | Dhir et al. |
| 7,030,649 B1 * | 4/2006 | Balasubramanian et al. .. 326/38 |
| 7,124,391 B1 | 10/2006 | Patterson |
| 7,185,293 B1 * | 2/2007 | Ofer ................................ 326/38 |
| 7,194,600 B2 | 3/2007 | Douglass et al. |
| 7,266,725 B2 * | 9/2007 | Vorbach et al. ................ 714/25 |
| 7,389,487 B1 * | 6/2008 | Chan et al. ..................... 716/50 |
| 7,518,396 B1 | 4/2009 | Kondapalli et al. |
| 7,539,848 B1 | 5/2009 | Douglass et al. |
| 7,669,168 B1 | 2/2010 | Patterson |
| 7,906,983 B2 | 3/2011 | Fulks, III |
| 8,493,091 B2 | 7/2013 | Sugiyama |

* cited by examiner

PARTIAL RECONFIGURATION AND IN-SYSTEM DEBUGGING

PRIORITY AND RELATED APPLICATION DATA

This application claims priority and benefit to co-pending and commonly assigned U.S. patent application Ser. No. 13/441,566, titled "PARTIAL RECONFIGURATION AND IN-SYSTEM DEBUGGING," by Alan Louis Herrmann, et al., filed Apr. 6, 2012 which claims priority to U.S. Provisional Patent Application No. 61/473,697, titled "PARTIAL RECONFIGURATION AND IN-SYSTEM DEBUGGING," by Alan Louis Herrmann, et al., filed on Apr. 8, 2011, all of which are hereby incorporated by reference in their entirety and for all purposes.

TECHNICAL FIELD

The present disclosure generally relates to partial reconfiguration and in-system debugging.

DESCRIPTION OF RELATED ART

A programmable logic device (PLD) is a semiconductor integrated circuit that contains logic circuitry that can be programmed to perform a host of logic functions. In a typical scenario, a logic designer uses computer-aided design (CAD) tools to design a custom logic circuit. These tools use information regarding the hardware capabilities of a given programmable logic device to help the designer implement the custom logic circuit using multiple resources available on that given programmable logic device. In many instances, a programmable logic device may support partial reconfiguration or the ability to have part of its logic reconfigured to other functionalities while other parts of the PLD remain active.

However, mechanisms for debugging circuits utilizing partial reconfiguration are limited and hindered because reconfiguration of the device may interfere with in-system debugging.

OVERVIEW

The present application relates to systems and methods for in-system debugging for a programmable logic device that are compatible with partial reconfiguration.

In accordance with various embodiments of the present disclosure, there is provided a programmable logic device that receives several instantiations of logic. One of the instantiations of logic is implemented within a reconfigurable region of logic within the programmable logic device. Implementing the instantiation of logic may further include implementing a port configured to receive signals from within the reconfigurable region of logic and configured to provide the signals to a signal interface implemented within a fixed region of logic. The signals may provide information corresponding to the current configuration of the instantiation of logic. Accordingly, the port may provide an interface between the reconfigurable region of logic and the signal interface even after partial reconfiguration of the reconfigurable region of logic.

In accordance with various embodiments, the port may be configured to receive signals from probe points implemented within the reconfigurable region of logic. Moreover, the signal interface may be configured to receive signals from the port via additional logic implemented within the fixed region of logic of the PLD. This may be accomplished by providing signals from the port to an embedded logic analyzer, from the embedded logic analyzer to a debug hub, and then from the debug hub to the signal interface.

In accordance with additional embodiments, the port may be configured to receive signals from an embedded logic analyzer. The embedded logic analyzer may be configured to receive signals from probe points. The probe points and embedded logic analyzer may both be implemented within the reconfigurable region of logic. Moreover, the signal interface may be configured to receive signals from the port via additional logic implemented within the fixed region of logic of the PLD. This may be accomplished by providing signals from the port to a debug hub, and then from the debug hub to the signal interface.

DESCRIPTION OF PARTICULAR EMBODIMENTS

Figure 1:
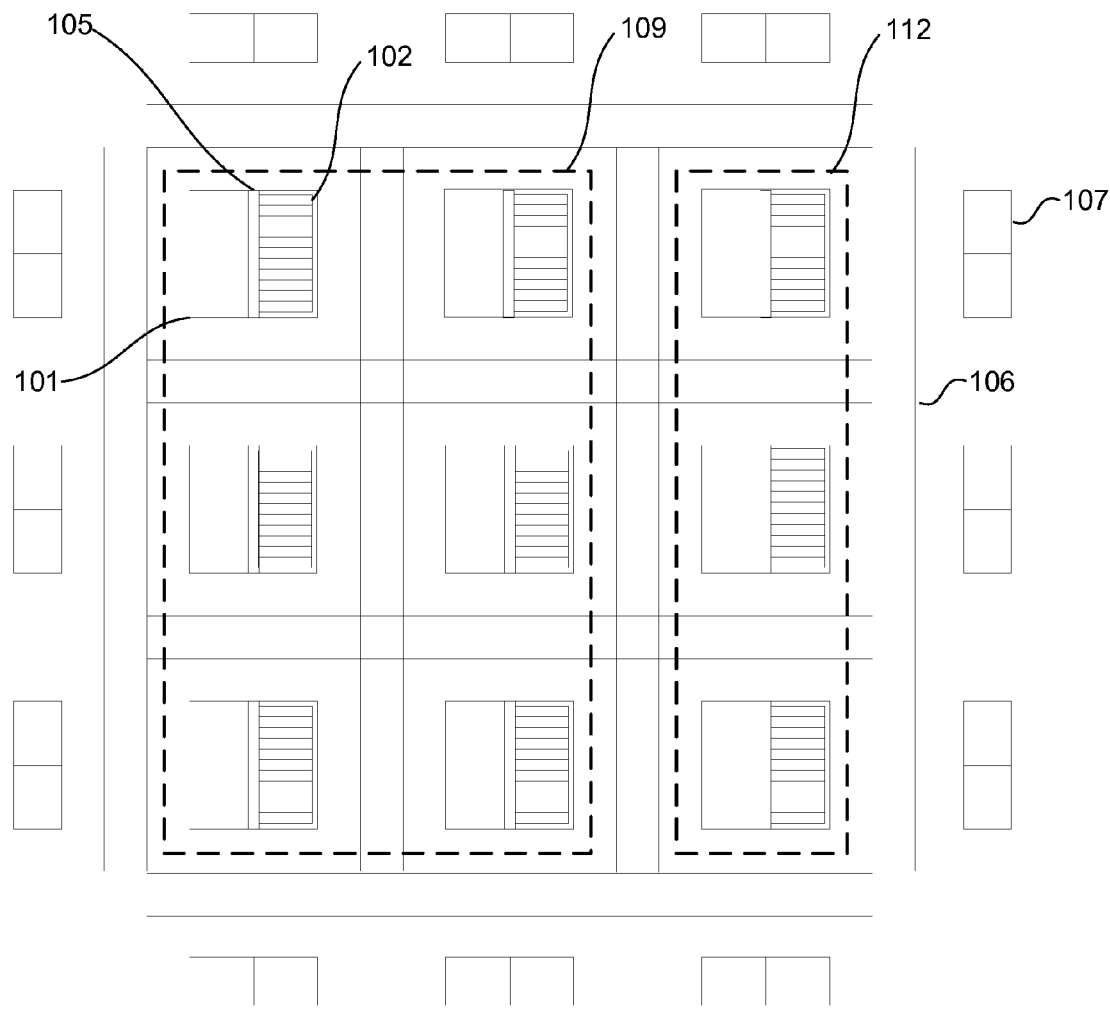
FIG. 1 is a schematic of a programmable logic device (PLD) that may be used during partial reconfiguration, in accordance with one embodiment.

Reference will now be made in detail to embodiments of the present invention contemplated by the inventors for carrying out the invention. Examples of these embodiments are illustrated in the accompanying drawings. While the invention is described in conjunction with these embodiments, it will be understood that it is not intended to limit the invention to the described embodiments. On the contrary, it is intended to cover alternatives, modifications, and equivalents as may be included within the spirit and scope of the invention as defined by the appended claims.

For example, the techniques and mechanisms of the present invention will be described in the context of particular types of devices. However, it should be noted that the techniques and mechanisms of the present invention apply to a variety of different types of devices. In the following description, numerous specific details are set forth in order to provide a thorough understanding of the present invention. Particular exemplary embodiments of the present invention may be implemented without some or all of these specific details. In other instances, well known process operations have not been described in detail in order not to unnecessarily obscure the present invention.

Various techniques and mechanisms of the present invention will sometimes be described in singular form for clarity. However, it should be noted that various embodiments include multiple iterations of a technique or multiple instantiations of a mechanism unless noted otherwise. For example, a system uses a processor in a variety of contexts. However, it will be appreciated that a system can use multiple processors while remaining within the scope of the present invention unless otherwise noted. Furthermore, the techniques and mechanisms of the present invention will sometimes describe a connection between two entities. It should be noted that a connection between two entities does not necessarily mean a direct, unimpeded connection, as a variety of other entities may reside between the two entities. For example, a processor may be connected to memory, but it will be appreciated that a variety of bridges and controllers may reside between the processor and memory. Consequently, a connection does not necessarily mean a direct, unimpeded connection unless otherwise noted.

Conventional methods of partial reconfiguration are limited because they interfere with conventional methods and systems of real-time debugging. For example, a debugging system may require the insertion of logic into a design implemented within a reconfigurable region of logic of a programmable logic device (PLD). The embedded logic may provide signals to other logic within the PLD which may ultimately provide the signals to an external computing system through a signal interface. If the PLD is partially reconfigured, then the reconfigurable region of logic within the PLD changes, while the rest of the PLD does not. Accordingly, the embedded logic providing signals to the downstream debugging system may change locations within the reconfigurable region of logic during the process of reconfiguration. The change in the configuration of the embedded logic results in severed connections between nodes observed within the reconfigurable region and other circuitry implemented in the fixed region. Accordingly, the computing system may lose connectivity and signal visibility within the system due to the process of partial reconfiguration.

The disclosed implementations provide the ability to debug a design implemented in a programmable logic device (PLD) by probing the state of internal signals within the design in a manner that is compatible with partial reconfiguration. Thus, implementations of the disclosed methods and systems allow an in-system debugging tool to monitor, in real-time, signal behavior in a system utilizing partial reconfiguration. This may be accomplished by providing a fixed interface, such as a port, between a region of logic within the PLD that remains fixed, and a region of logic within the PLD that is reconfigured during partial reconfiguration.

In one example, the fixed interface may be a port that provides a constant interface between nodes observed by embedded logic within a reconfigurable region of the PLD, and components of an in-system debugging tool, such as an embedded logic analyzer, implemented within a fixed region of the PLD. In various embodiments, the fixed interface may refer to a port that maintains fixed connections with the embedded logic analyzer regardless of what configuration of logic is implemented within the reconfigurable region of logic. Thus, partial reconfiguration of the region does not sever the connection between the node and the logic analyzer or affect signal visibility at an external computing system that may be monitoring the PLD.

In another example, the fixed interface may be a port that provides a constant interface between an embedded logic analyzer implemented within a reconfigurable region of logic of the PLD, and a signal interface implemented within a fixed region of logic of the PLD which may provide communication with an external computing system. Thus, according to various embodiments, the embedded logic analyzer may be implemented in the reconfigurable region of logic and reconfigured according to a process of partial reconfiguration. The embedded logic analyzer then provides signals to the signal interface through the port. Thus, according to various embodiments, the port provides a constant interface between the embedded logic analyzer and the signal interface. In other words, the port may provide connectivity between the embedded logic analyzer and the signal interface regardless of which instantiation of logic is implemented within the reconfigurable region of logic. Accordingly, an external computing system connected to the signal interface may continue to monitor signals from within the PLD in a manner that is compatible with partial reconfiguration.

FIG. 1 is a schematic of a programmable logic device (PLD) that may be used to implement one or more instantiations of logic during partial reconfiguration, in accordance with one embodiment. PLD 100 may include a plurality of logic blocks arranged in rows and columns. Each logic block 101 of the plurality of logic blocks may further comprise a column of logic elements 102 capable of storing values indicating a logic function. Local interconnect 105 connects logic elements 102 to each other to allow communication within PLD 100. Local interconnect 105 is connected to signal interface 107 through routing interconnect 106. Accordingly, logic block 101 may communicate with an external computing system through local interconnect 105, routing interconnect 106, and signal interface 107.

PLD 100 may be programmed with various logic functions depending upon the configuration of the plurality of logic blocks within PLD 100. Thus, reconfiguration of the plurality of logic blocks results in reconfiguration of PLD 100 and a change in the functionality of PLD 100. According to various embodiments, PLD 100 may be partially reconfigured. That is, some logic blocks may remain static and continue executing existing functionality according to existing programming, while other logic blocks may be reconfigured with new programming and execute a new functionality. Accordingly, PLD 100 may include fixed region of logic 109 that includes logic blocks that remain static, and reconfigurable region of logic 112 that includes logic blocks that may be dynamically reconfigured. While fixed region of logic 109 may be configured and parameterized prior to implementation, it may be referred to as "fixed" because reconfiguration of the fixed region of logic would require reconfiguration of all of PLD 100. In contrast, reconfiguration of reconfigurable region of logic 112 does not require reconfiguration of all of PLD 100 and may be accomplished dynamically without disturbing the operation of the rest of PLD 100.

Signal interface 107 allows PLD 100 to communicate with external circuitry. According to various embodiments, signal interface 107 may use a bidirectional serial interface protocol, such as the joint test action group (JTAG) protocol. Thus, according to various embodiments, signal interface 107 may be a JTAG interface that includes several JTAG pins allowing communication between a JTAG state machine within PLD 100 and an external computing system.

It will be appreciated that PLD 100 is merely exemplary and should in no way be construed as limiting the present application. For example, while PLD 100 is shown with only one fixed region of logic and one reconfigurable region of logic, PLD 100 may include several fixed regions of logic and several reconfigurable regions of logic. Moreover, signal interface 107 need not necessarily utilize a JTAG protocol.

Signal interface 107 may use any bidirectional interface protocol that may be appreciated by one of skill in the art.

Figure 2:
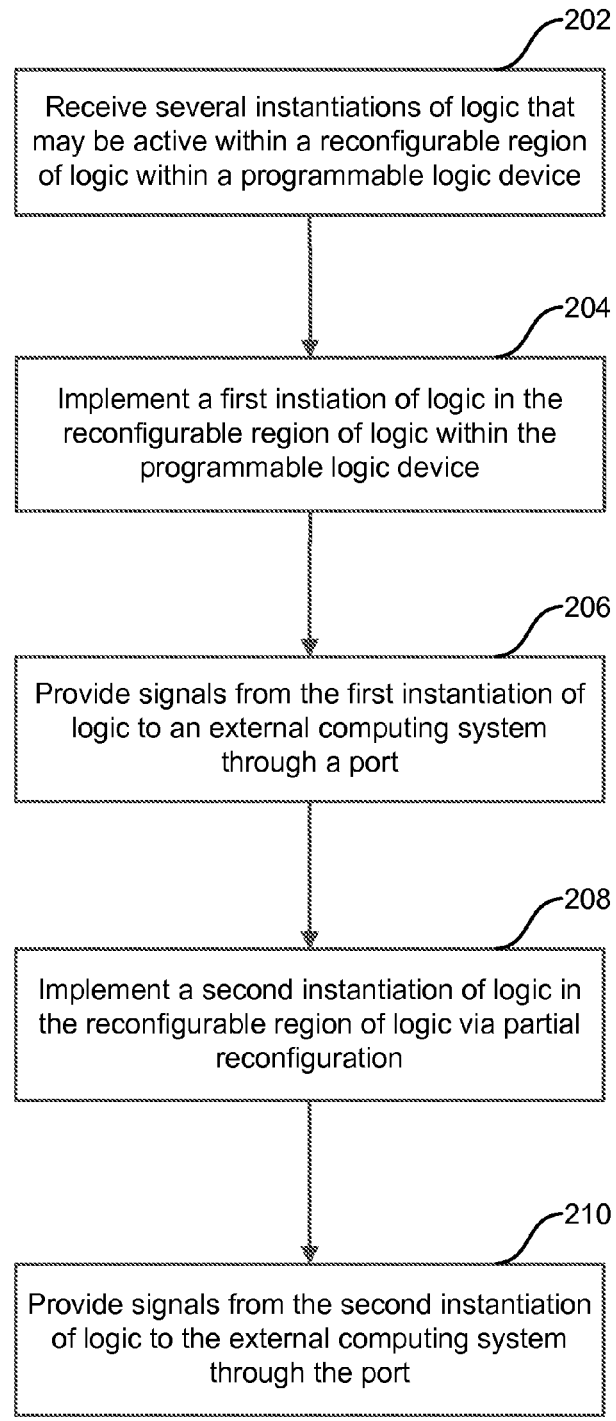
FIG. 2 is an exemplary flowchart showing a process 200 for partially reconfiguring a programmable logic device that is compatible with in-system debugging, in accordance with one embodiment.

FIG. 2 is an exemplary flowchart showing a process 200 for partially reconfiguring a programmable logic device that is compatible with in-system debugging, in accordance with one embodiment. The capability of in-system debugging may refer to the ability of a circuit or system to monitor and capture real-time signal behavior originating from nodes within the programmable logic device. This capability allows a user to analyze signals originating from within a configuration of logic designed by the user, and determine whether or not parts and components of the design implemented within the programmable logic device are operating according to design specifications. According to various embodiments, the user may be monitoring signals from nodes within the PLD prior to and after the circuit has undergone partial reconfiguration.

In process 200, at block 202, a programmable logic device may receive several instantiations of logic. According to various embodiments, an instantiation of logic may refer to a sub-hierarchy of logic that is active in an implemented circuit. For example, a user may generate a hardware description language (HDL) hierarchy that includes several sub-hierarchies representing various logic functions. However, once implemented, only one sub-hierarchy instantiation might be active within the PLD. Thus, according to various embodiments, the active sub-hierarchy would be the instantiation of logic that is currently implemented. The instantiations of logic may be designed by a user according to processes described in greater detail below with reference to FIGS. 2 and 7.

In process 200, at block 204, a first instantiation of logic may be implemented in the programmable logic device. As discussed in greater detail below, a configuration controller responsible for reconfiguring the PLD may utilize a processor implemented in a fixed region of logic to implement the first instantiation in a reconfigurable region of logic within the PLD.

In process 200, at block 206, the first instantiation of logic implemented on the PLD may provide signals to an external computing system through a port. In various embodiments, the signals originate from logic embedded within the user generated HDL configuration files. The embedded logic may monitor certain nodes within the implemented logic and may convey information about the operation of the instantiation of logic that has been implemented. The embedded logic may provide signals conveying information about the nodes through wires connected to other logic within the PLD. While the embedded logic inserts additional logic and wires into the configuration file that is implemented in the reconfigurable region of logic, it does not change the hierarchy designed by the user. Thus, the embedded logic "taps" the circuit in which it is embedded at specified nodes without altering its operation.

In various embodiments, the signals from the embedded logic may be provided to a port that allows communication between the reconfigurable region of logic and the fixed region of logic. In particular embodiments, the port may function as a constant interface between the signals originating from the embedded logic implemented within the reconfigurable region of logic and various other components implemented in the fixed region of logic of the PLD. This may be accomplished by routing the signals to the port for each instantiation of logic that is implemented in the reconfigurable region of logic. The routing may be accomplished by a compiler during a design process. Thus, by routing signals from the nodes to the fixed connections of the port, the interface between the fixed region of logic and the reconfigurable region of logic remains constant because it does not change among different instantiations of logic. Accordingly, an external computing system connected to a signal interface residing in the fixed region of logic may receive signals and communicate with the embedded logic within the reconfigurable region regardless of which instantiation of logic is implemented.

Returning to FIG. 2, in process 200, at block 208, a second instantiation of logic may be implemented within the reconfigurable region of logic within the PLD via partial reconfiguration. As previously discussed, the configuration controller of the PLD may utilize circuitry and components residing within a fixed region of logic of the PLD to dynamically implement the new instantiation of logic.

In process 200, at block 210, the second instantiation of logic implemented on the PLD may provide signals to an external computing system through the port. In various embodiments, the second instantiation of logic may also include embedded logic that provides signals from specified nodes. In particular embodiments, the embedded logic of the second instantiation of logic may be different than the embedded logic of the first instantiation. The second instantiation of logic may include different components and different logic functions than the first instantiation of logic. Thus, the logic embedded within the second instantiation may monitor signals from different nodes associated with different components. However, the signals from the embedded logic of both the first and second instantiation of logic are routed to the fixed connections of the port. Thus, communication between the reconfigurable region of logic and the signal interface implemented in the fixed region of logic remains constant because the signal interface may communicate with the reconfigurable region of logic regardless of which instantiation is implemented. Accordingly, a computing system monitoring signals provided by the signal interface may continue to monitor signals from within the reconfigurable region of the PLD after the logic instantiated within the region has been reconfigured.

Figure 3:
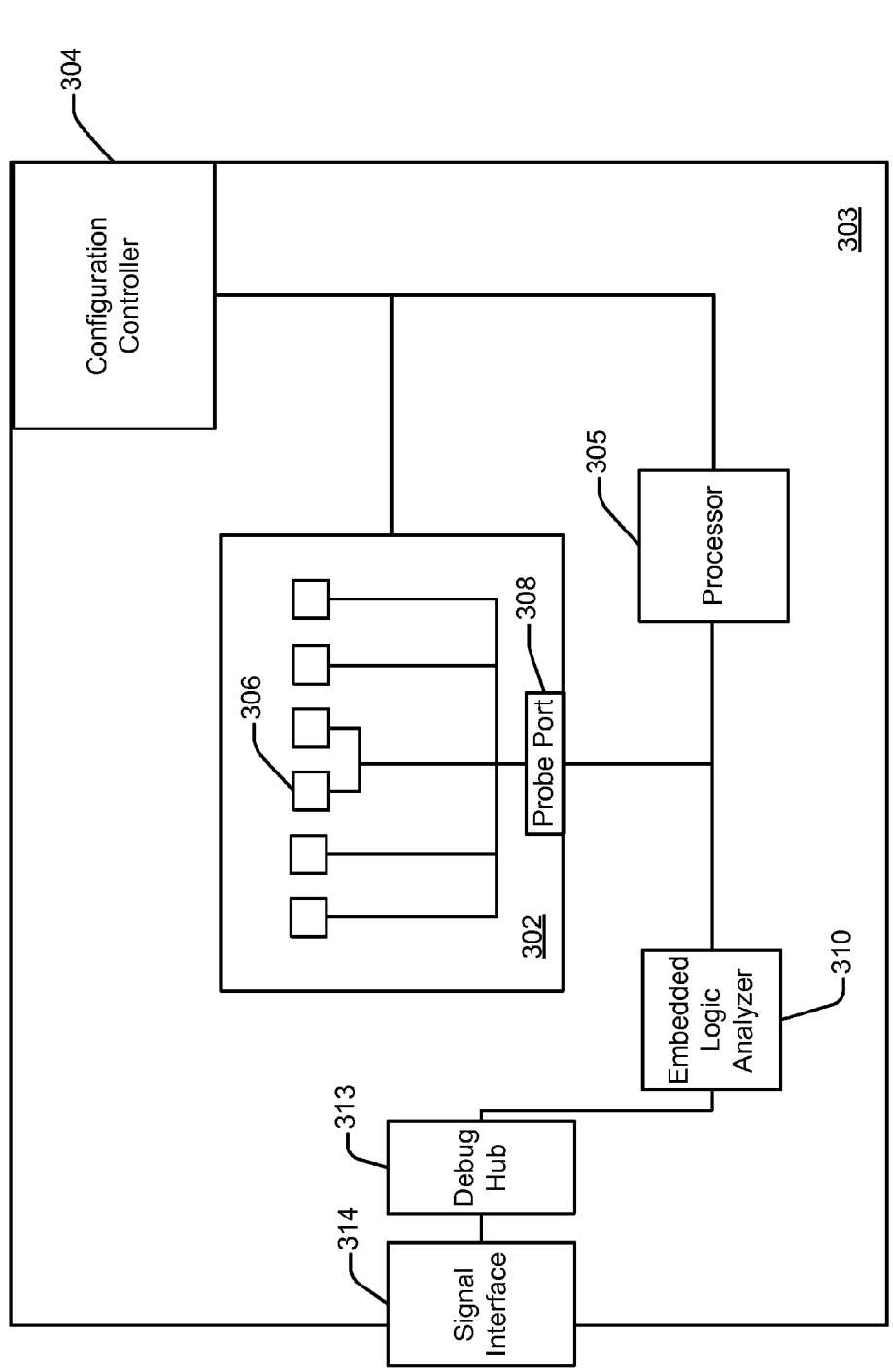
FIG. 3 is a system diagram illustrating a programmable logic device 300 utilizing a probe port, in accordance with one embodiment.

FIG. 3 is a system diagram illustrating a programmable logic device 300 utilizing a probe port, in accordance with one embodiment. A probe port may be a sub-region of a reconfigurable region of logic within a PLD that functions as a constant interface between the reconfigurable region of logic and a fixed region of logic. Thus, according to particular embodiments, PLD 300 may include reconfigurable region 302, fixed region 303 which, according to some embodiments, may include implemented logic not included in reconfigurable region 302, configuration controller 304, processor 305, probe points 306 within reconfigurable region 302, probe port 308, embedded logic analyzer 310, debug hub 313, and signal interface 314. In various embodiments, fixed region 303 includes all elements implemented on PLD 300 except for those implemented within reconfigurable region 302. Thus, according to various embodiments, fixed region 303 and reconfigurable region 302 are mutually exclusive.

According to various embodiments, reconfigurable region 302 may be a region of logic within PLD 300 that may be reconfigured during partial reconfiguration. Thus, reconfigurable region 302 may be reconfigured from a first instantiation of logic to a second instantiation of logic without disturbing the circuitry that has been implemented in the fixed region 303.

In particular embodiments, fixed region 303 may be configured according to a design initially implemented on PLD 300. Thus, fixed region 303 may include several circuitry components, such as additional debug hubs, ports, and processors, as discussed in greater detail below. Once configured, fixed region 303 remains in its current configuration and is not reconfigured during partial reconfiguration. Thus, according to various embodiments, implementation of a first or second instantiation of logic reconfigurable region 302 does not affect the configuration of logic in fixed region 303. In particular embodiments, reconfiguration of fixed region 303 may occur if reconfiguration of the entire PLD is performed.

In various embodiments, configuration controller 304 may be logic within PLD 300 that is responsible for implementing configuration files on PLD 300. Thus, configuration controller 304 may control the implementation of reconfigurable region 302 and fixed region 303. Thus, according to various embodiments, configuration controller 304 controls the implementation of an instantiation of logic in reconfigurable region 302.

In various embodiments, processor 305 may be utilized by configuration controller 304 to execute operations involved in the implementation of configuration files on PLD 300. In particular embodiments, processor 305 may be parameterized by a user. For example, a user may specify bit widths, processor speed, and other performance characteristics of the processor in order to customize performance of the processor. In various embodiments, processor 305 may be a general purpose reduced instruction set computing (RISC) processor.

According to particular embodiments, probe points 306 may be logic embedded in an instantiation of logic implemented in reconfigurable region 302. Probe points 306 may provide signals from designer-specified points in a circuit that has been implemented in reconfigurable region 302. Thus, according to various embodiments, a designer may specify several points in a circuit that will be monitored in each instantiation of logic that will be implemented. Moreover, the designer may alter the location of the probe points 306 to vary the points that are monitored from instantiation to instantiation.

In various embodiments, probe port 308 provides an interface between probe points 306 and embedded logic analyzer 310 implemented in fixed region 303. For example, probe port 308 may include a specified number of connections between fixed region 303 and reconfigurable region 302. The number of connections may be specified by a designer at a design stage. For example, a user may specify that probe port 308 provides eight connections between reconfigurable region 302 and fixed region 303. In this example, probe port 308 would then include eight wires. One end of each wire would be connected to embedded logic analyzer 310 in the fixed region 303. The other end of the wire may be connected to a corresponding probe point 306 in reconfigurable region 302. According to various embodiments, a compiler utilized during a design process would perform the appropriate routing to ensure that this connection exists for each instantiation of logic generated and each set of probe points selected. Accordingly, regardless of which instantiation of logic is implemented in reconfigurable region 302, probe port 308 ensures that probe points 306 are connected to embedded logic analyzer 310.

In particular embodiments, embedded logic analyzer 310 may be a circuit that monitors a set number of signals, buffers them based on user defined trigger conditions, and communicates with debug hub 313 to provide signal visibility to a computing system. The user defined trigger functions may be a specific event or condition that a user wishes to monitor. For example, a user may choose to monitor a bus that may be implemented in a particular instantiation of logic. The user may define a trigger function to be a write cycle. Therefore, according to particular embodiments, whenever the bus is used in a write cycle, embedded logic analyzer 310 will communicate with debug hub 313 to provide signal visibility to the computing system, thus allowing the user of the computing system to monitor and capture specific signals originating from a particular region of logic in real time. In various embodiments, varieties of embedded logic analyzers are available, or may be created by the user.

According to various embodiments, debug hub 313 may be a hub that communicates with one or more circuits within PLD 300. Debug hub 313 arbitrates communication between these circuits and signal interface 314. Thus, in particular embodiments, debug hub 313 determines when a signal from embedded logic analyzer 310 may be provided to a computing system through signal interface 314. In various embodiments, debug hub 313 may be a JTAG hub that operates in accordance with a bidirectional serial interface protocol, such as the joint test action group (JTAG) protocol or IEEE 1149.1.

In particular embodiments, signal interface 314 is a signal interface that allows bidirectional communication between PLD 300 and a computing system. Signal interface 314 may utilize a bidirectional serial interface protocol, such as the JTAG protocol. Thus, according to some embodiments, signal interface 314 may be a JTAG debug interface including a JTAG state machine and JTAG pins associated with external JTAG signals. The JTAG pins may be hardware attached to the external packaging of PLD 300, while the JTAG state machine may be implemented within fixed region 303 of PLD 300.

Figure 4:
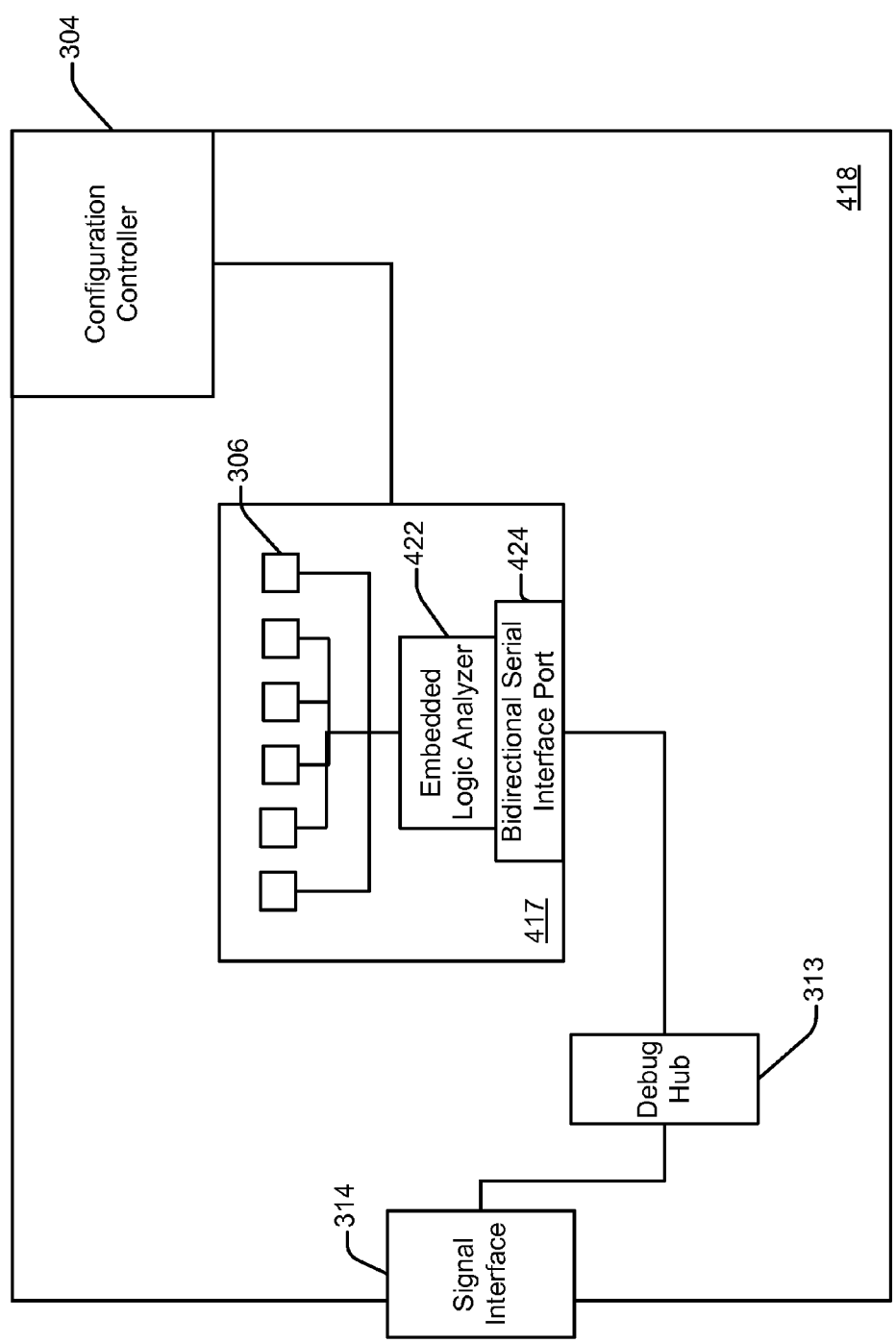
FIG. 4 is a system diagram illustrating a programmable logic device 416 utilizing a bidirectional serial interface port, in accordance with one embodiment.

FIG. 4 is a system diagram illustrating a programmable logic device 416 utilizing a bidirectional serial interface port, in accordance with one embodiment. In various embodiments, a bidirectional serial interface port may be a sub-region of a reconfigurable region of logic within a PLD that functions as a constant interface between an embedded logic analyzer implemented within the reconfigurable region of logic and a debug hub implemented within the fixed region of logic. Thus, according to particular embodiments, PLD 416 may include reconfigurable region 417, fixed region 418 which, according to some embodiments, may include implemented logic not included in reconfigurable region 417, configuration controller 304, probe points 306 within reconfigurable region 417, embedded logic analyzer 422, bidirectional serial interface port 424, debug hub 313, and signal interface 314. As similarly discussed above, in various embodiments, fixed region 418 includes all elements implemented on PLD 416 except for those implemented within reconfigurable region 417. Thus, according to various embodiments, fixed region 418 and reconfigurable region 417 are mutually exclusive.

According to various embodiments, reconfigurable region 417 may be a region of logic within PLD 416 that may be reconfigured during partial reconfiguration. Thus, reconfigurable region 417 may be reconfigured from a first instantiation of logic to a second instantiation of logic without disturbing the logic that has been implemented in the fixed region 418. As discussed above, the implementation of configuration files for regions 417 and 418 may be controlled by configuration controller 304.

In various embodiments probe points 306 may be connected to embedded logic analyzer 422. As discussed above, embedded logic analyzer 422 may be a circuit that monitors a set number of signals, buffers them based on user defined trigger conditions, and communicates with additional circuitry to provide signal visibility to a computing system. According to various embodiments, embedded logic analyzer 422 may be implemented within reconfigurable region 417 thus allowing partial reconfiguration of embedded logic analyzer 422. The ability to partially reconfigure embedded logic analyzer 422 allows a user to change and define trigger conditions used to monitor and capture signals without having to reconfigure the entire PLD.

According to various embodiments, reconfigurable region 417 may also include bidirectional serial interface port 424. Bidirectional serial interface port 424 provides a constant interface between embedded logic analyzer 422 implemented in reconfigurable region 417 and debug hub 313 implemented in fixed region 418. An instantiation of logic implemented in reconfigurable region 417 may have signals provided by probe points 306. As discussed above, a compiler utilized in a design environment may be used to route the signals to bidirectional serial interface port 424 for each instantiation of logic implemented within reconfigurable region 417 when the configuration files are generated. Thus, if an instantiation of logic to be implemented includes embedded logic analyzer 422, signals from probe points 306 are routed to the embedded logic analyzer 422, and then routed to bidirectional serial interface port 424. Bidirectional serial interface port 424 may then provide the signals to debug hub 313. Accordingly, while the number of probe points 306 and the composition of embedded logic analyzer 422 may vary among instantiations of logic via partial reconfiguration, connectivity between bidirectional serial interface port 424 and debug hub 313 remains constant because for each instantiation of logic, probe points 306 are routed to bidirectional serial interface port 424, and bidirectional serial interface port 424 is connected to debug hub 313.

According to various embodiments, the output of bidirectional serial interface port 424 utilizes a bidirectional serial interface protocol, such as the JTAG protocol.

Figure 5:
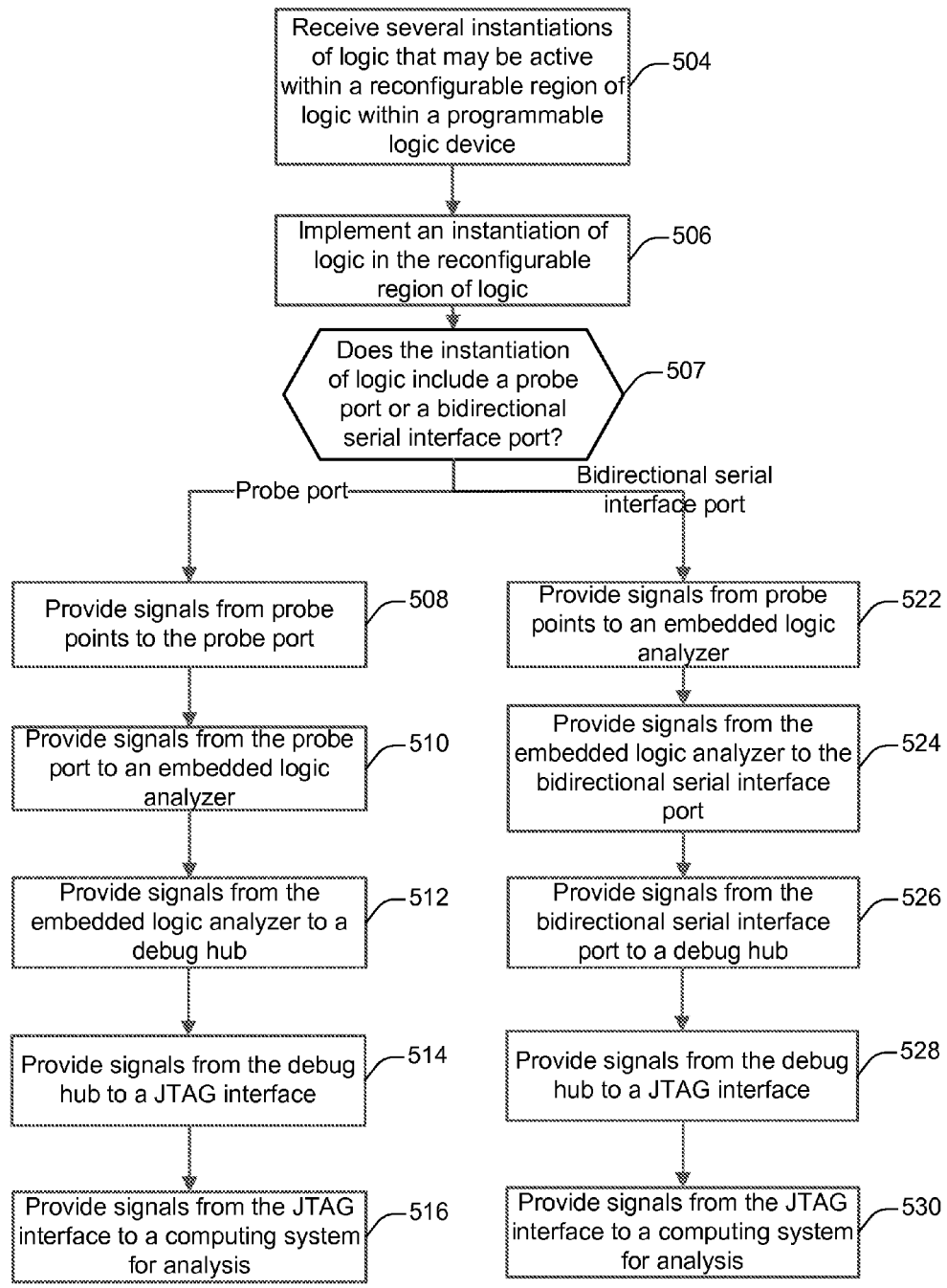
FIG. 5 is an exemplary flowchart showing a process 500 for partially reconfiguring a programmable logic device that may allow in-system debugging by utilizing either a probe port or a bidirectional serial interface port, in accordance with one embodiment.

FIG. 5 is an exemplary flowchart showing a process 500 for partially reconfiguring a programmable logic device that may allow in-system debugging by utilizing either a probe port or a bidirectional serial interface port, in accordance with one embodiment.

In various embodiments, in process 500, at block 504, the PLD may receive several instantiations of logic. As previously discussed, the instantiations of logic may include logic functions designed by a user to be implemented within a reconfigurable region of logic of the PLD. At block 506, an instantiation from the plurality of instantiations may be implemented in the reconfigurable region of logic.

In process 500, at block 507, it is determined whether or not the first instantiation of logic includes a probe port or a bidirectional serial interface port. As discussed further below, in various embodiments, the type of port that is included may be determined during the design process. A user may choose whether a probe port or a bidirectional serial interface port is desired. After the selection has been made, the appropriate port may be incorporated into the configuration file via a compiler.

If a probe port has been included in the instantiation of logic, in process 500, at block 508, relevant nodes associated with specified probe points may provide signals to the probe port during operation of the instantiation of logic.

In process 500, at block 510, the probe port may provide signals from the probe points to the embedded logic analyzer. As discussed above, the probe points may be implemented in the reconfigurable region of logic. Moreover, the location of the probe points may vary among instantiations of logic. However, because the signals from the probe points are routed to the fixed connections of the probe port for each instantiation of logic that is implemented, the probe port provides a constant interface between the probe points implemented in the reconfigurable region and the embedded logic analyzer implemented in the fixed region of logic.

In process 500, at block 512, the embedded logic analyzer may provide signals from the port to the debug hub. In various embodiments, the signals may originate from the probe points embedded in the logic of the implemented instantiation. The embedded logic analyzer may then buffer the signals based on a set of trigger conditions. The embedded logic analyzer may then provide signals to the debug hub.

In process 500, at block 514, the debug hub may provide signals from the logic analyzer to a JTAG interface. At block 516, the JTAG interface may then provide the signals to an external computing system for further analysis.

Returning to block 507, if a bidirectional serial interface port has been included in the instantiation of logic, process 500 may proceed to block 522. At block 522, nodes associated with probe points may provide signals to an embedded logic analyzer that has also been incorporated into the instantiation of logic and implemented in the reconfigurable region of logic.

In process 500, at block 524, the embedded logic analyzer may provide signals to the bidirectional serial interface port. As previously discussed, the embedded logic analyzer may then buffer the signals based on a set of trigger conditions. The trigger conditions may be loaded via partial reconfiguration because the embedded logic analyzer has been implemented in the reconfigurable region of logic. The embedded logic analyzer may then provide signals to the bidirectional serial interface port.

In process 500, at block 526, the bidirectional serial interface port may provide signals from the logic analyzer to a debug hub. In various embodiments, the logic analyzer may be implemented in a reconfigurable region of logic while the debug hub may be implemented in a fixed region of logic. Thus, the bidirectional serial interface port provides an interface between the logic analyzer and the debug hub that remains constant and provides physical connections between the two regions of logic regardless of which instantiation is implemented.

In process 500, at block 528, the debug hub may provide signals from the embedded logic analyzer to the JTAG interface. At block 530, the JTAG interface may then provide the signals to an external computing system for further analysis.

Figure 6:
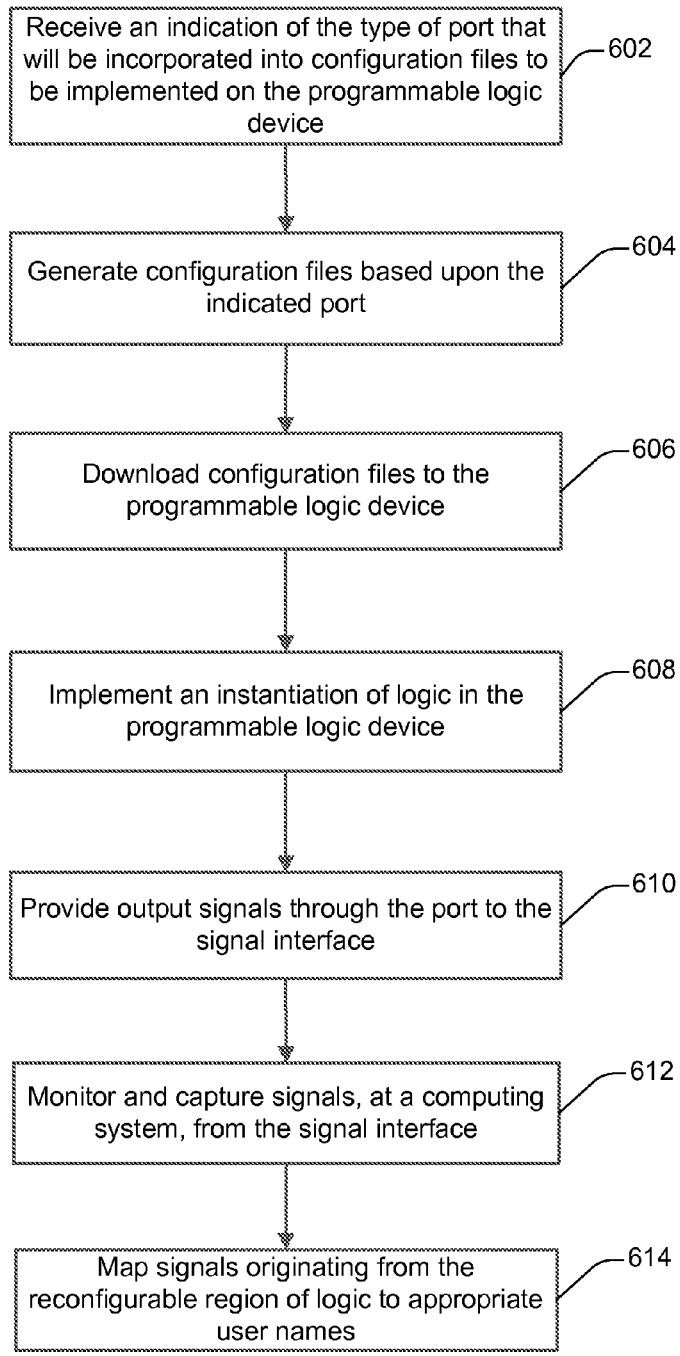
FIG. 6 is an exemplary flowchart showing a process 600 for designing, implementing, debugging, and mapping signals from a partially reconfigurable programmable logic device, in accordance with one embodiment.

FIG. 6 is a flowchart showing a process 600 for designing, implementing, debugging, and mapping signals from a partially reconfigurable logic device, in accordance with one embodiment.

In process 600, at block 602, an indication of a type of port to be incorporated into a design that will be implemented on a PLD may be received. According to some embodiments, the indication may be received at a system used to implement a programmable chip. As discussed in greater detail below, the system may include an input stage and a generator program which are used to generate a logic description. The logic description may be a configuration file containing an HDL hierarchy. In various embodiments, a user of the system, such as a designer of a circuit, may indicate that a probe port should be implemented in the PLD. Port options may be presented to and selected by a user through a user interface, such as a graphical user interface.

In various embodiments, at block 604, a configuration file may be generated in response to receiving the indication of port type. According to various embodiments, the user indication of port type may be incorporated into configuration files representing several instantiations of logic. Thus, if a probe port is selected, a probe port may be incorporated into the configuration file designed by the user and applied to several instantiations of logic within a logic description. At block 606, the configuration files may be downloaded to the PLD. At block 608, one of the instantiations of logic within the configuration files may be implemented in the reconfigurable region of logic within the PLD.

In process 600, at block 610, signals may be generated by the implemented instantiation of logic, captured in real-time by probe points and an embedded logic analyzer, and provided to a computing system through the JTAG interface, in accordance with process 500.

In various embodiments, at block 612, the computing system may monitor the signals provided through the JTAG interface. As previously discussed, the port implemented in the PLD provides the computing system with continuous signal visibility. Thus, the computing system may monitor signals provided by a logic analyzer after the PLD has been partially reconfigured. This allows a user of the computing system to monitor and debug the operation of the PLD in real-time in a manner that is consistent with partial reconfiguration of the PLD.

In process 600, at block 614, the computing system may map signals from the PLD to appropriate user names that may be specified by a user. The computing system may map the signals by looking at tags associated with the signals received from the PLD. A tag may provide information about the current configuration of a reconfigurable region of logic in the PLD. For example, a tag may indicate that a reconfigurable region is currently implementing function 1, which may be, for example, a processor core. The reconfigurable region may then be reconfigured through a process of partial reconfiguration to implement function 2, which may be, for example, a different processor core or perhaps an entirely different logic function, such as a bus.

In various embodiments, the tags are provided to the computing system by the embedded logic analyzer through the JTAG interface. The embedded logic analyzer may store information that specifies which function should be associated with which tag. Furthermore, trigger conditions stored within the embedded logic analyzer may indicate when a tag should be associated with a function, and when the resulting tagged signal should be provided to the computing system.

If a probe port is implemented in the reconfigurable region, then the embedded logic analyzer would be implemented in a fixed region of logic within the PLD. Thus, a user may specify associations between functions and tags stored within the embedded logic analyzer upon initial configuration of the fixed region of logic. However, in this situation, the logic analyzer would require information about the current configuration of the reconfigurable region of logic in order to provide accurate tagging of the signals. For example, a logic analyzer may tag signals originating from probe points within the reconfigurable region of logic as being associated with a processor core. If a new component, such as a bus, is implemented in the reconfigurable region through partial reconfiguration, the probe points may be in different locations and require different trigger conditions. If the logic analyzer does not have accurate information about the bus that is currently implemented in the reconfigurable region, it may still report that signals are originating from a processor. This would result in an incorrect mapping of the signals at the computing system that would impair real-time signal analysis.

Accordingly, in various embodiments, information about the current configuration of the reconfigurable region of logic may be provided to the logic analyzer from other sources within the PLD. As previously discussed, a configuration controller and a processor implemented in the fixed region of logic may be responsible for implementing the reconfigurable region of logic during partial reconfiguration. In this situation, the processor and configuration controller may both have information about the current configuration of the reconfigurable region of logic. Thus, according to various embodiments, a signal may be provided from the configuration controller or processor to the embedded logic analyzer. The signal would provide the information about the current configuration of the reconfigurable region of logic that may allow accurate tagging of the signals from the currently implemented probe points.

As previously discussed, in various embodiments, a bidirectional serial interface port may be implemented in the reconfigurable region of logic. In this situation, the embedded logic analyzer would be implemented in the reconfigurable region of logic. Thus, the associations between tags and functions of logic may be changed through partial reconfiguration. When the embedded logic analyzer is implemented in the reconfigurable region of logic, no additional signals from other components in the fixed region of logic are required to determine the current configuration of the reconfigurable region for accurate tagging. In particular embodiments, the embedded logic analyzer has direct access to information regarding the current configuration of the reconfigurable region because the relevant information may be implemented into registers within the embedded logic analyzer during the process of partial reconfiguration. The logic analyzer may then use this information to provide accurate tagging of the signals when the signals are output through the bidirectional serial interface port and to the computing system through the JTAG interface.

Figure 7:
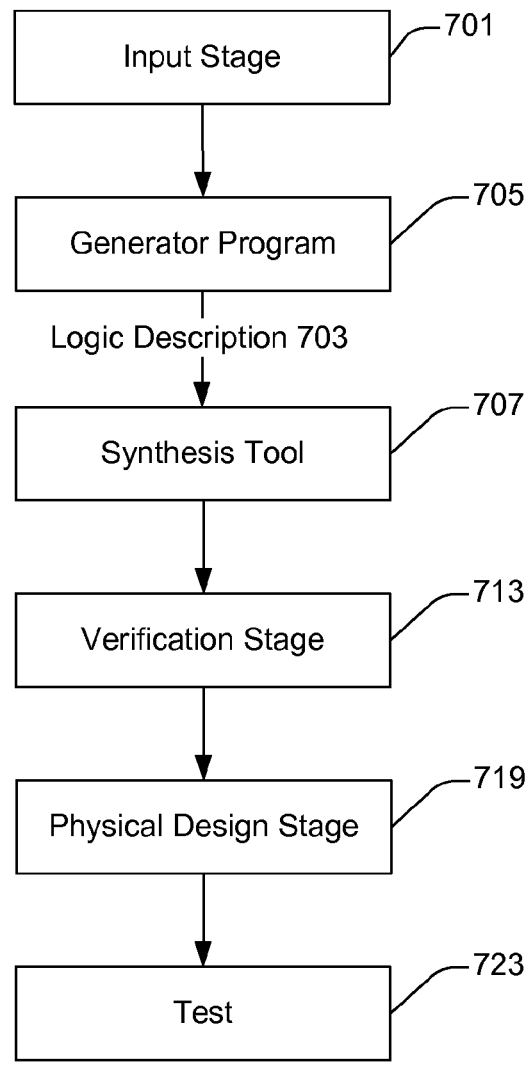
FIG. 7 illustrates a technique for implementing a programmable chip, in accordance with one embodiment.

FIG. 7 illustrates a technique for simulating and implementing a programmable chip, in accordance with one embodiment of the present invention. Such a technique may be used to simulate and implement a PLD, as discussed above. An input stage 701 receives selection information typically from a user for logic such as a processor core as well as other components to be implemented on an electronic device. In one example, the input received is in the form of a high-level language program. A generator program 705 creates a logic description 703 and provides the logic description along 703 with other customized logic to any of a variety of synthesis tools, place and route programs, and logic configuration tools to allow a logic description to be implemented on an electronic device. Moreover, the logic description 703 may be provided to a simulation tool 709 that may simulate the logic description 703 prior to implementation.

In one example, an input stage 701 often allows selection and parameterization of components to be used on an electronic device. The input stage 701 also allows configuration of hard coded logic. In some examples, components provided to an input stage include intellectual property functions, megafunctions, and intellectual property cores. In various embodiments, intellectual property functions, megafunctions, and intellectual property cores may refer to proprietary logic functions, logic blocks, and processor cores that have been previously generated by a third party developer. The input stage 701 may be a graphical user interface using wizards for allowing efficient or convenient entry of information. The input stage may also be a text interface or a program reading a data file such as a spreadsheet, database table, or schematic to acquire selection information. The input stage 701 produces an output containing information about the various modules selected. At this stage, the user may enter security information about individual components that needs to be isolated. For example, different levels of component security and which components are allowed to communicate with each other may be entered.

In typical implementations, the generator program 705 can identify the selections and generate a logic description with information for implementing the various modules. The generator program 705 can be a Perl script creating HDL files such as Verilog, Abel, VHDL, and AHDL files from the module information entered by a user. In one example, the generator program identifies a portion of a high-level language program to accelerate. The other code is left for execution on a processor core. According to various embodiments, the generator program 705 identifies pointers and provides ports for each pointer. One tool with generator program capabilities is System on a Programmable Chip (SOPC) Builder available from Altera Corporation of San Jose, Calif. The generator program 705 also provides information to a synthesis tool 707 to allow HDL files to be automatically synthesized. In some examples, a logic description is provided directly by a designer. Hookups between various components selected by a user are also interconnected by a generator program. Some of the available synthesis tools are Leonardo Spectrum, available from Mentor Graphics Corporation of Wilsonville, Oreg. and Synplify available from Synplicity Corporation of Sunnyvale, Calif. The HDL files may contain technology specific code readable only by a synthesis tool. The HDL files at this point may also be passed to a simulation tool.

As will be appreciated by one of skill in the art, the input stage 701, generator program 705, and synthesis tool 707 can be separate programs. The interface between the separate programs can be a database file, a log, or simply messages transmitted between the programs. For example, instead of writing a file to storage, the input stage 701 can send messages directly to the generator program 705 to allow the generator program to create a logic description. Similarly, the generator program can provide information directly to the synthesis tool instead of writing HDL files. Similarly, input stage 701, generator program 705, and synthesis tool 707 can be integrated into a single program.

A user may select various modules and an integrated program can then take the user selections and output a logic description in the form of a synthesized netlist without intermediate files. Any mechanism for depicting the logic to be implemented on an electronic device is referred to herein as a logic description. According to various embodiments, a logic description is an HDL file such as a VHDL, Abel, AHDL, or Verilog file. A logic description may be in various stages of processing between the user selection of components and parameters to the final configuration of the device. According to other embodiments, a logic description is a synthesized netlist such as an Electronic Design Interchange Format Input File (EDF file). An EDF file is one example of a synthesized netlist file that can be output by the synthesis tool 707.

A synthesis tool 707 can take HDL files and output EDF files. Tools for synthesis allow the implementation of the logic design on an electronic device. Some of the available synthesis tools are Leonardo Spectrum, available from Mentor Graphics Corporation of Wilsonville, Oreg. and Synplify available from Synplicity Corporation of Sunnyvale, Calif. Various synthesized netlist formats will be appreciated by one of skill in the art.

A verification stage 713 typically follows the synthesis stage 707. The verification stage checks the accuracy of the design to ensure that an intermediate or final design realizes the expected requirements. A verification stage typically includes simulation tools and timing analysis tools. Tools for simulation allow the application of inputs and the observation of outputs without having to implement a physical device. Simulation tools provide designers with cost effective and efficient mechanisms for both functional and timing verification of a design. Functional verification involves the circuit's logical operation independent of timing considerations. Parameters such as gate delays are disregarded.

Timing verification involves the analysis of the design's operation with timing delays. Setup, hold, and other timing requirements for sequential devices such as flip-flops are confirmed. Some available simulation tools include Synopsys VCS, VSS, and Scirocco, available from Synopsys Corporation of Sunnyvale, Calif. and Cadence N.C.-Verilog and NC-VHDL available from Cadence Design Systems of San Jose, Calif. After the verification stage 713, the synthesized netlist file can be provided to physical design tools 719 including place and route and configuration tools. A place and route tool locates logic cells on specific logic elements of a target hardware device and connects wires between the inputs and outputs of the various logic elements in accordance with logic and security provided to implement an electronic design. According to various embodiments of the present invention, the place and route tool may perform the techniques of the present invention to implement the various security requirements and rules as defined by the user. The iterative technique may be transparent to the user, but the resulting device can be physically tested at 723.

For programmable logic devices, a programmable logic configuration stage can take the output of the place and route tool to program the logic device with the user selected and parameterized modules. According to various embodiments, the place and route tool and the logic configuration stage are provided in the Quartus Development Tool, available from Altera Corporation of San Jose, Calif. As will be appreciated by one of skill in the art, a variety of synthesis, place and route, and programmable logic configuration tools can be used using various techniques of the present invention.

As noted above, different stages and programs can be integrated in a variety of manners. According to one embodiment, the input stage 701, the generator program 705, the synthesis tool 707, the verification tools 713, and physical design tools 719 are integrated into a single program. The various stages are automatically run and transparent to a user. The program can receive the user-selected modules, generate a logic description depicting logic for implementing the various selected modules, and implement the electronic device. As will be appreciated by one of skill in the art, HDL files and EDF files are mere examples of a logic description. Other file formats as well as internal program representations are other examples of a logic description.

Figure 8:
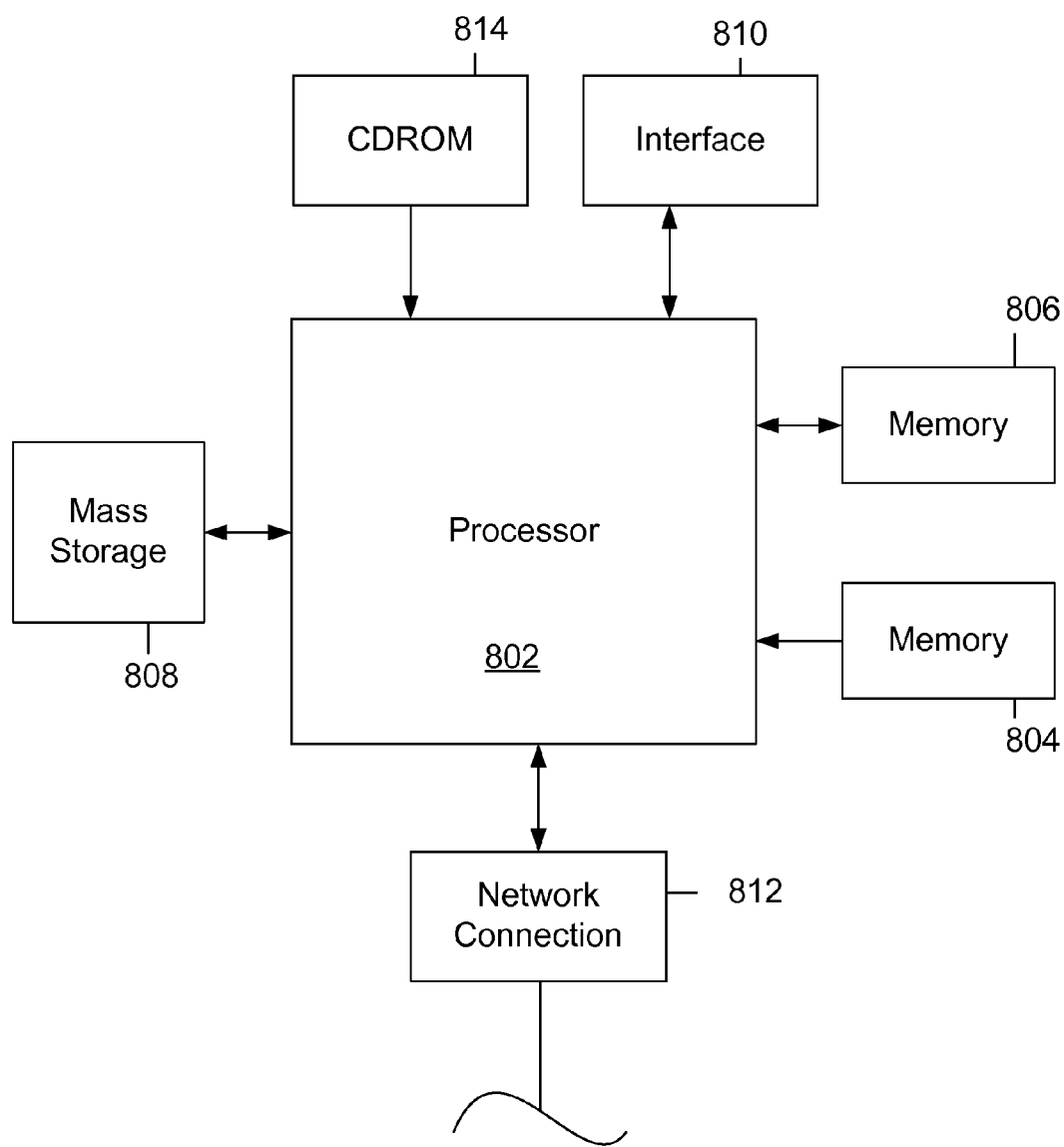
FIG. 8 illustrates one example of a computing system.

FIG. 8 illustrates one example of a computing system. Computing system 800 includes any number of processors 802 (also referred to as central processing units, or CPUs) that are coupled to devices including memory 802 (typically a random access memory, or "RAM"), memory 804 (typically a read only memory, or "ROM"). The processors 802 can be operable to generate an electronic design. As is well known in the art, memory 804 acts to transfer data and instructions uni-directionally to the CPU and memory 802 are used typically to transfer data and instructions in a bi-directional manner.

Both of these memory devices may include any suitable type of the computer-readable media described above. A mass storage device 808 is also coupled bi-directionally to CPU 802 and provides additional data storage capacity and may include any of the computer-readable media described above. The mass storage device 808 may be used to store programs, data and the like and is typically a secondary storage medium such as a hard disk that is slower than memory. The mass storage device 808 can be used to hold a library or database of prepackaged logic or intellectual property functions, as well as information on generating particular configurations. It will be appreciated that the information retained within the mass storage device 808, may, in appropriate cases, be incorporated in standard fashion as part of memory 802 as virtual memory. A specific mass storage device such as a CD-ROM 814 may also pass data uni-directionally to the CPU.

CPU 802 is also coupled to an interface 810 that includes one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. The CPU 802 may be a design tool processor. Finally, CPU 802 optionally may be coupled to a computer or telecommunications network using a network connection as shown generally at 812. With such a network connection, it is contemplated that the CPU might receive information from the network, or might output information to the network in the course of performing the above-described process steps. It should be noted that computing system 800 might also be associated with devices for transferring completed designs onto a programmable chip. The above-described devices and materials will be familiar to those of skill in the computer hardware and software arts.

Although many of the components and processes are described above in the singular for convenience, it will be appreciated by one of skill in the art that multiple components and repeated processes can also be used to practice the techniques of the present invention.

While particular embodiments of the invention have been particularly shown and described with reference to specific embodiments thereof, it will be understood by those skilled in the art that changes in the form and details of the disclosed embodiments may be made without departing from the spirit or scope of the invention. For example, embodiments of the present invention may be employed with a variety of components and should not be restricted to the ones mentioned above. It is therefore intended that the invention be interpreted to include all variations and equivalents that fall within the true spirit and scope of the present invention.

What is claimed is:

1. An apparatus comprising:
    a first region of logic;
    a second region of logic for configuring between a first logic design and a second logic design; and
    a first port for receiving at least one signal from the second region of logic and providing the signal to the first region of logic, wherein the first logic design includes a first probe point associated with a first node of the first logic design, the second logic design includes a second probe point associated with a second node of the second logic design, and a signal associated with the first or second nodes provided to the first port based on the logic design configured in the second region of logic.

2. The apparatus of claim 1, further comprising:
    a logic analyzer coupled with the first port, the logic analyzer for providing the at least one signal to the first port.

3. The apparatus of claim 2, wherein the logic analyzer is further for configuring between a first trigger condition associated with the first logic design and a second trigger condition associated with the second logic design, and wherein the trigger condition is configured based on the logic design configured in the second region of logic.

4. The apparatus of claim 2, wherein the logic analyzer is further for providing a tag indicating a logic design implemented in the second region of logic to the first port.

5. The apparatus of claim 4, further comprising:
    a controller for providing the first logic design and the second logic design to the second region of logic, and wherein the controller is further for providing the tag associated with the logic design implemented in the second region of logic to the logic analyzer.

6. The apparatus of claim 1, wherein the first logic design is associated with a first number of probe points, and the second logic design is associated with a second number of probe points, the first number different than the second number.

7. The apparatus of claim 2, wherein the first port and the logic analyzer are implemented in the second region of logic.

8. A method for a device with a first region of logic and a second region of logic, the method comprising:
    receiving, at the device, a first logic design and a second logic design;
    configuring the second region of logic between the first logic design and the second logic design; and
    implementing a first port for receiving at least one signal from the second region of logic and providing the signal to the first region of logic, wherein the first logic design includes a first probe point associated with a first node of the first logic design, the second logic design includes a second probe point associated with a second node of the second logic design, and a signal associated with the first or second nodes provided to the first port based on the logic design configured in the second region of logic.

9. The method of claim 8, further comprising:
    implementing a logic analyzer coupled with the first port, the logic analyzer for providing the at least one signal to the first port.

10. The method of claim 9, wherein the logic analyzer is further for configuring between a first trigger condition associated with the first logic design and a second trigger condition associated with the second logic design, and wherein the trigger condition is configured based on the logic design configured in the second region of logic.

11. The method of claim 9, wherein the logic analyzer is further for providing a tag indicating a logic design implemented in the second region of logic to the first port.

12. The method of claim 11, further comprising:
    providing, by a controller, the first logic design and the second logic design to the second region of logic, and wherein the controller is further for providing the tag associated with the logic design implemented in the second region of logic to the logic analyzer.

13. The method of claim 8, wherein the first logic design is associated with a first number of probe points, and the second logic design is associated with a second number of probe points, the first number different than the second number.

14. The method of claim 8, wherein the first port and the logic analyzer are implemented in the second region of logic.

15. A non-transitory tangible computer-readable storage medium storing instructions executable by a computing device with a first region of logic and a second region of logic to perform a method comprising:
    receiving, at the device, a first logic design and a second logic design;
    configuring the second region of logic between the first logic design and the second logic design; and
    implementing a first port for receiving at least one signal from the second region of logic and providing the signal to the first region of logic, wherein the first logic design includes a first probe point associated with a first node of the first logic design, the second logic design includes a second probe point associated with a second node of the second logic design, and a signal associated with the first or second nodes provided to the first port based on the logic design configured in the second region of logic.

16. The non-transitory tangible computer-readable storage medium of claim 15, further comprising:

implementing a logic analyzer coupled with the first port, the logic analyzer for providing the at least one signal to the first port.

17. The non-transitory tangible computer-readable storage medium of claim 16, wherein the logic analyzer is further for configuring between a first trigger condition associated with the first logic design and a second trigger condition associated with the second logic design, and wherein the trigger condition is configured based on the logic design configured in the second region of logic.

* * * * *